(12) United States Patent
MacDougall et al.

(10) Patent No.: US 8,507,804 B2
(45) Date of Patent: Aug. 13, 2013

(54) ELECTRICAL CONNECTOR WITH SOLDER COLUMNS

(75) Inventors: Alan MacDougall, Beaverton, OR (US); Robert Daniel Hilty, Harrisburg, PA (US); George Jyh-Shann Chou, Mechanicsburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 528 days.

(21) Appl. No.: 12/710,189

(22) Filed: Feb. 22, 2010

(65) Prior Publication Data

US 2011/0203838 A1 Aug. 25, 2011

(51) Int. Cl.
*H05K 1/09* (2006.01)

(52) U.S. Cl.
USPC ........... 174/257; 174/256; 174/263; 174/261; 174/260

(58) Field of Classification Search
USPC ........... 174/257, 256, 263, 261, 260; 439/66; 438/118
See application file for complete search history.

(56) References Cited

U.S. PATENT DOCUMENTS

| | | | |
|---|---|---|---|
| 5,438,223 A | 8/1995 | Higashi et al. | |
| 5,673,846 A * | 10/1997 | Gruber | 228/180.22 |
| 5,751,068 A | 5/1998 | McMahon et al. | |
| 6,156,484 A | 12/2000 | Bassous et al. | |
| 6,260,264 B1 | 7/2001 | Chen et al. | |
| 7,156,669 B2 | 1/2007 | Asai et al. | |

* cited by examiner

*Primary Examiner* — Timothy Thompson
*Assistant Examiner* — Andargie M Aychillhum (57) ABSTRACT

An electrical connector is provided for mating with an electrical component. The connector includes a substrate having a mating side, and a solder column extending from the mating side of the substrate. The solder column includes a base that is engaged with the substrate. The solder column extends a length away from the mating side of the substrate to a tip. The tip includes a contact surface that is configured to engage and electrically connect to an electrical contact of the electrical component. The solder column is linearly tapered along at least a portion of the length from the base to the tip.

18 Claims, 6 Drawing Sheets

ELECTRICAL CONNECTOR WITH SOLDER COLUMNS

BACKGROUND OF THE INVENTION

The subject matter described and/or illustrated herein relates generally to electrical connectors, and more particularly, to interposer-type electrical connectors.

The increased demand for smaller electrical devices such as cell phones and portable computers has led to a decreased size and increased density of internal electrical components of the device. To accommodate the smaller size and increased density, some electrical components are being mounted directly together using solder or the like to eliminate any intervening connectors. For example, in the past integrated circuits were typically mounted on a motherboard of an electrical device using an interposer. The interposer included an array of contacts that were placed between two opposing arrays of contacts of the integrated circuit and the motherboard to provide an electrical connection between the electrical contacts of the opposing contact arrays. However, some integrated circuits are currently being mounted directly to a motherboard using solder balls that engage the opposing contact arrays. Elimination of the interposer may reduce a height of an assembly of the integrated circuit and motherboard and/or may enable the assembly to have an increased number and/or density of electrical contacts for a given height.

It is sometimes desirable to test the function of some or all of the various electrical components of an electrical device, for example before selling or shipping the electrical device. However, when electrical components are mounted directly together using solder or the like, a permanent connection is established between the electrical components. Accordingly, if one of the electrical components fails the functional test, it may be difficult to salvage the other electrical component. For example, disconnecting the electrical component that passed the functional test may damage the passing electrical component, which may require that the passing electrical component be scrapped or subjected to a time-consuming and/or expensive refurbishment process. Moreover, even if the passing electrical component is not damaged when disconnected from the failed electrical component, remnants of the solder balls may need to be removed and/or new solder balls may need to be applied, which may be time-consuming and/or costly. As a consequence of such problems, many electrical components that pass functional tests are scrapped along with the electrical component that failed the functional test. As integrated circuits and other electrical components increase in complexity and functionality, it may be especially costly to scrap passing electrical components.

BRIEF DESCRIPTION OF THE INVENTION

In one embodiment, an electrical connector is provided for mating with an electrical component. The connector includes a substrate having a mating side, and a solder column extending from the mating side of the substrate. The solder column includes a base that is engaged with the substrate. The solder column extends a length away from the mating side of the substrate to a tip. The tip includes a contact surface that is configured to engage and electrically connect to an electrical contact of the electrical component. The solder column is linearly tapered along at least a portion of the length from the base to the tip.

In another embodiment, an interposer is provided for electrically connecting first and second electrical components. The interposer includes a substrate having opposite first and second mating sides, and a first solder column extending from the first mating side of the substrate. The first solder column includes a base that is engaged with the substrate. The first solder column extends a length from the base to a tip. The tip includes a first contact surface that is configured to engage and electrically connect to an electrical contact of the first electrical component. The first solder column is linearly tapered along at least a portion of the length from the base to the tip. A second solder column extends from the second mating side of the substrate. The second solder column includes a second contact surface that is configured to engage and electrically connect to an electrical contact of the second electrical component.

In another embodiment, an electrical connector is provided for mating with an electrical component. The connector includes a substrate having a mating side, and a solder column extending from the mating side of the substrate. The solder column includes a base that is engaged with the substrate. The solder column extends a length away from the mating side of the substrate to a tip. The tip includes a contact surface that is configured to engage and electrically connect to an electrical contact of the electrical component. The solder column includes a pyramidal or a conical shape.

DETAILED DESCRIPTION OF THE INVENTION

Figure 1:
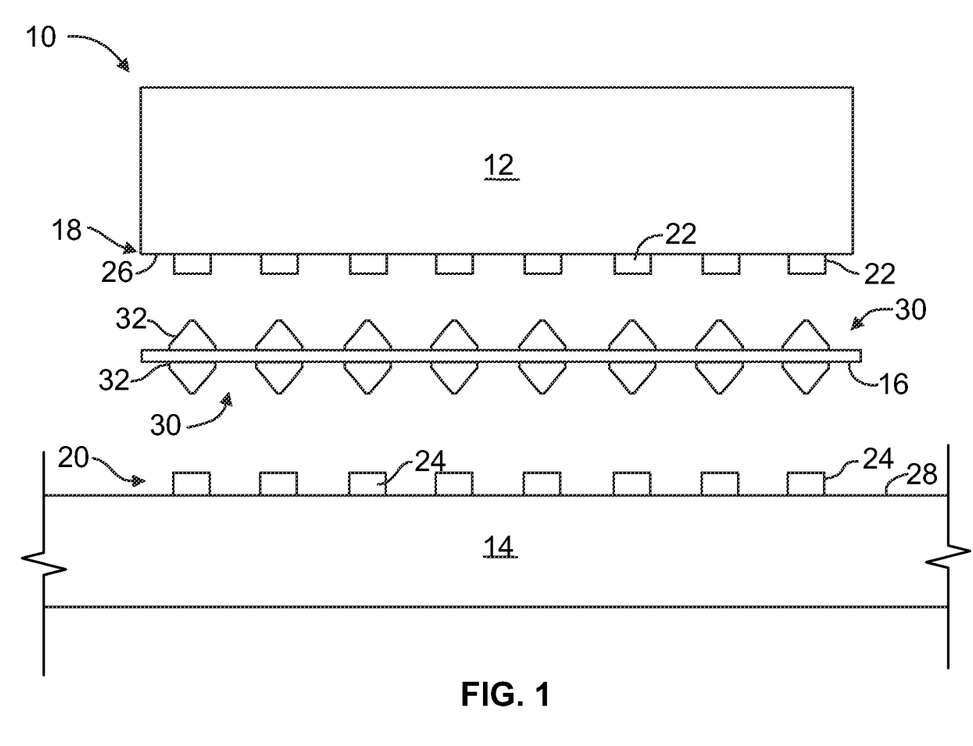
FIG. 1 is an exploded elevational view of an exemplary embodiment of an electrical component assembly.

FIG. 1 is an exploded elevational view of an exemplary embodiment of an electrical component assembly 10. The assembly 10 includes a pair of electrical components 12 and 14 and an interposer 16 for electrically connecting the electrical components 12 and 14. The electrical components 12 and 14 each include a respective array 18 and 20 of a plurality of electrical contacts 22 and 24 on opposing surfaces 26 and 28 thereof, respectively. The array 18 of the electrical component 12 substantially matches the pattern of the array 20 of the electrical component 14. The interposer 16 includes a pair of opposite arrays 30 of a plurality of solder columns 32 for electrically connecting the arrays 18 and 20 of the electrical components 12 and 14. The arrays 30 of the interposer 16 substantially match the pattern of the arrays 18 and 20 of the electrical components 12 and 14, respectively.

The electrical components 12 and 14 may each be any suitable type of electrical component, such as, but not limited to, printed circuit boards, integrated circuits, electrical modules, other electrical devices, and/or the like. In one exemplary embodiment, the electrical component 12 is an integrated circuit and the electrical component 14 is a motherboard printed circuit board. The arrays 18 and 20 may each be any suitable type of array of electrical contacts that enables operative electrical connection between the electrical components 12 and 14, such as, but not limited to, Pin Grid Arrays (PGAs), Land Grid Arrays (LGAs), Ball Grid Arrays (BGAs), and/or the like. Moreover, the arrays 18 and 20 may have any suitable configuration, arrangement, number, and/or pattern of electrical contacts that enables operative electrical connection between the electrical components 12 and 14.

Figure 2:
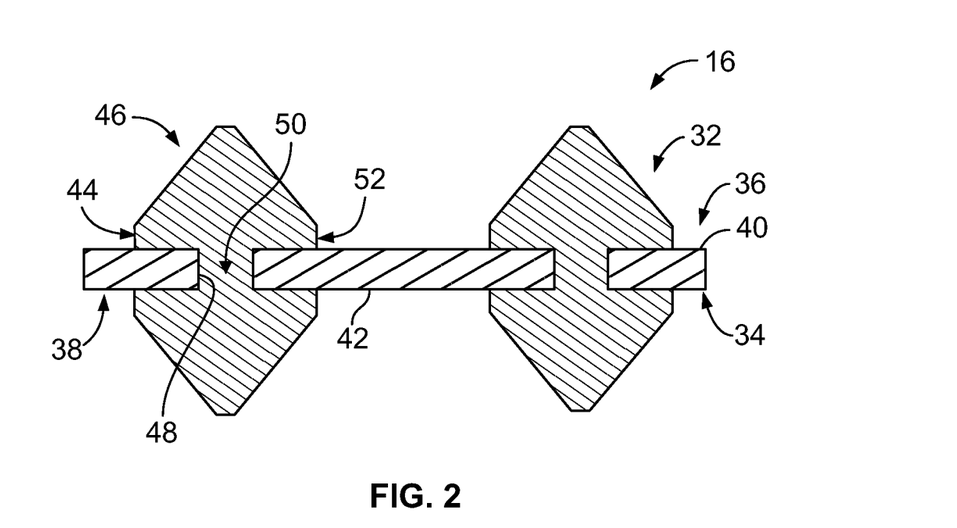
FIG. 2 is a cross-sectional view of a portion of an exemplary embodiment of an interposer of the electrical component assembly shown in FIG. 1.

FIG. 2 is a cross-sectional view of a portion of an exemplary embodiment of the interposer 16. The interposer 16 includes a substrate 34 that supports the solder columns 32. The substrate 34 includes opposite mating sides 36 and 38 having respective mating side surfaces 40 and 42. Each solder column 32 includes a base 44 and a tip 46. Each solder column 32 extends a length away from the corresponding mating side 36 or 38 of the substrate 34 to the tip 46. The solder columns 32 are substantially identical, except for their locations on the corresponding mating side 36 or 38 of the substrate 34. Specifically, each solder column 32 on the mating side 36 of the substrate 34 includes a substantially identical solder column 32 opposite thereto on the mating side 38. In the exemplary embodiment, the substrate 34 includes a plurality of through holes 48 and the base 44 of each solder column 32 includes a stem 50 that is received within the corresponding through hole 48. The holes 48 are arranged in a pattern that substantially matches the pattern of each of the electrical contact arrays 18 and 20 (FIG. 1) of the electrical components 12 and 14 (FIGS. 1, 7, and 8), respectively. Each through hole 48 of the substrate 34 receives the stems 50 of two solder columns 32 that are opposite one another on the mating sides 36 and 38. As can be seen in FIG. 2, in addition to the stem 50, the base 44 of each solder column 32 includes a portion 52 that extends over, and is engaged with, the corresponding mating side surface 40 or 42. The substrate 34 may include any number of solder columns 32 for electrically connecting any number of the electrical contacts 22 and 24.

Figure 11:
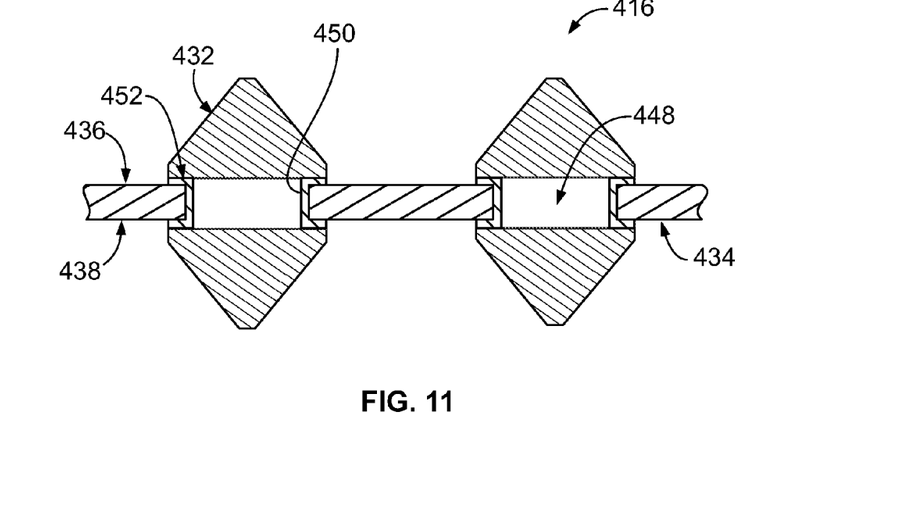
FIG. 11 is a cross-sectional view of a portion of an exemplary alternative embodiment of an interposer.

In the exemplary embodiment, the two substantially identical solder columns 32 located opposite one another on the mating sides 36 and 38 of the substrate 34 are directly connected together at the stems 50 thereof, such that the opposite solder columns 32 form an integral structure extending completely through the corresponding through hole 48 (whether the two opposite solder columns 32 are formed integrally or attached together after formation). Alternatively, the stems 50 are indirectly electrically connected together using another structure, such as, but not limited to, an intervening electrically conductive element (not shown), coating the through hole 48 with an electrical conductor (not shown), and/or the like. For example, FIG. 11 is a cross-sectional view of a portion of an exemplary alternative embodiment of an interposer 416. The interposer 416 includes a substrate 434 having opposite mating sides 436 and 438 and a plurality of through holes 448 that are each coated with an electrically conductive coating 450. The coating 450 of each hole 448 includes a land 452 on each of the mating sides 436 and 438. At each hole 448, solder columns 432 are engaged with the lands 452 and extend outwardly from the mating sides 436 and 438. The coating 450 of each hole 448 electrically connects opposite solder columns 432 to each other. In addition or alternative to the lands 452, one or more of the solder columns 432 may include a stem (not shown) that engages the conductive coating 450 within the corresponding hole 448 to electrically connect the solder column 432 to the coating 450.

Referring again to FIG. 2, the substrate 34 may be fabricated from any suitable material(s) that enables the substrate 34 to function as described herein, such as, but not limited to polyimide, polyester, epoxy, Kapton®, other materials having a low and uniform dielectric constant, electrically conductive materials (such as, but not limited to, stainless steel and/or the like), and/or the like. In some embodiments, the substrate 34 is fabricated entirely from one or more materials having a low and uniform dielectric constant (excluding any electrically conducting elements, traces, and the like). Alternatively, the substrate 34 is fabricated from one or more electrically conductive materials, such as, but not limited to, stainless steel and/or the like, that is at least partially covered with one or more materials having a low and uniform dielectric constant. The dielectric properties of the substrate 34 facilitate shielding the solder columns 32 from each other.

Figure 3:
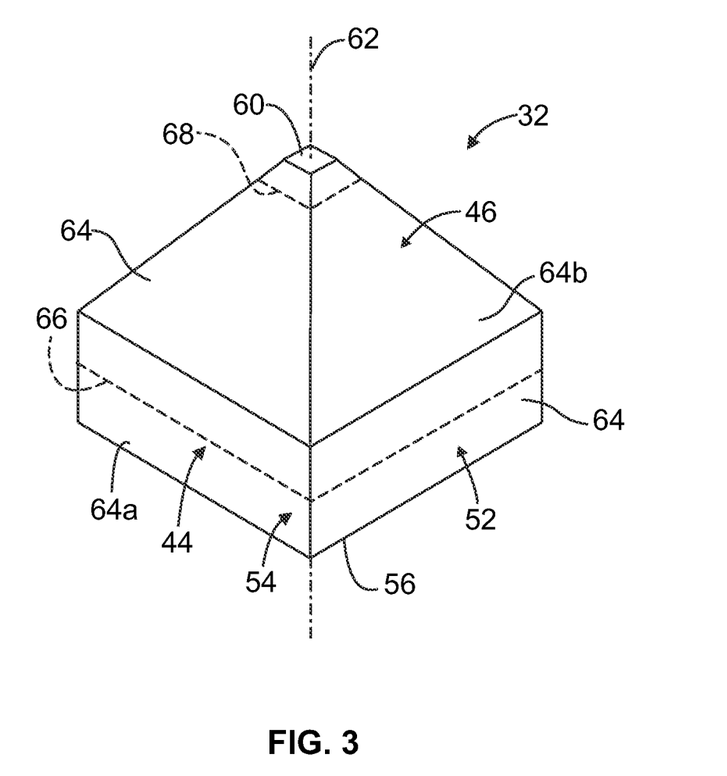
FIG. 3 is a perspective view of an exemplary embodiment of a solder column of the interposer shown in FIG. 2.
Figure 4:
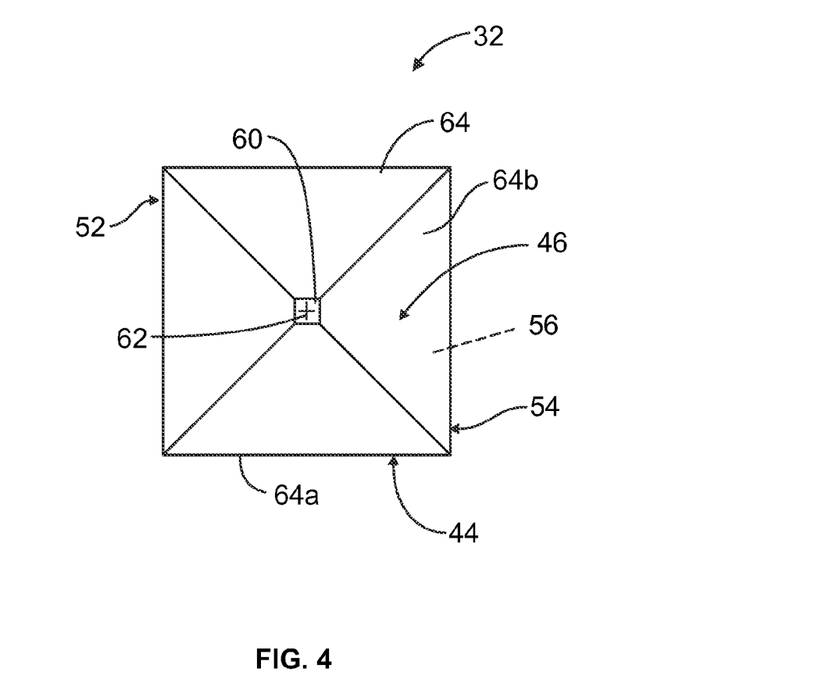
FIG. 4 is a top plan view of the solder column shown in FIG. 3.
Figure 5:
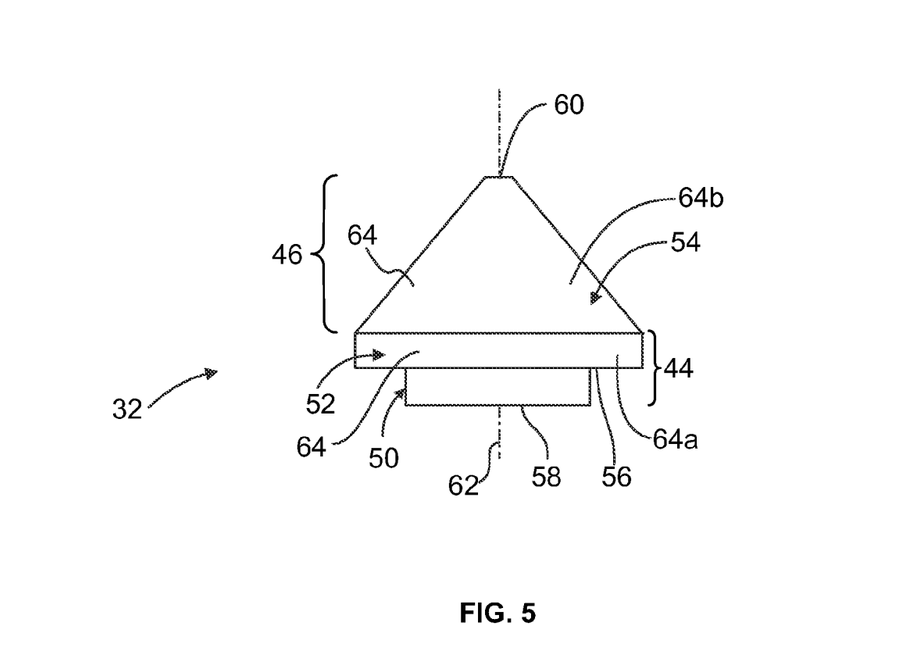
FIG. 5 is a side elevational view of the solder column shown in FIGS. 3 and 4.
Figure 7:
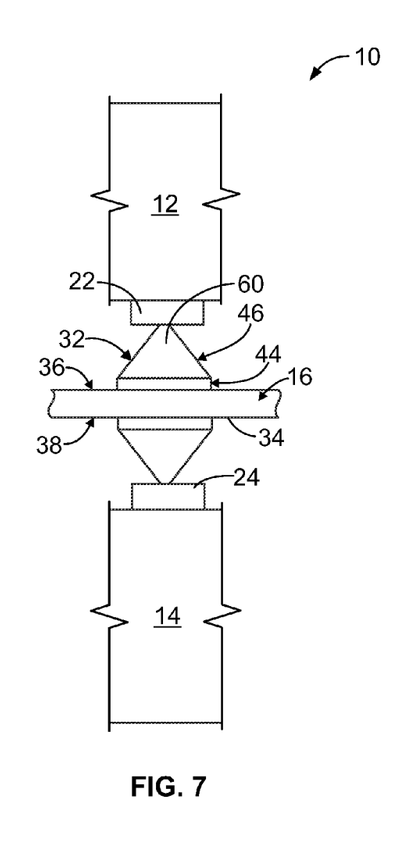
FIGS. 7 and 8 are elevational views of a portion of the electrical component assembly shown in FIG. 1.
Figure 8:
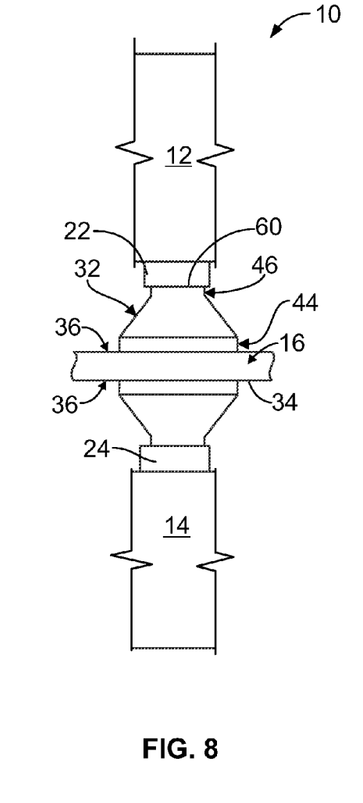

FIG. 3 is a perspective view of an exemplary embodiment of one of the solder columns 32. FIGS. 4 and 5 are a top plan and side elevational views, respectively, of the solder column 32 shown in FIG. 3. Each solder column 32 includes a body 54 fabricated from any type of solder. The solder column body 54 includes the base 44 and the tip 46. The base 44 includes the stem 50 (not visible in FIGS. 3 and 4) and the portion 52 that extends over the corresponding mating side surface 40 or 42 (FIG. 2) of the substrate 34 (FIGS. 2, 7, and 8). The base portion 52 includes a surface 56 that engages the corresponding mating side surface 40 or 42. The stem 50 includes an end surface 58 (not visible in FIGS. 3 and 4) and the tip 46 includes a contact surface 60. The contact surface 60 of the tip is configured to engage a corresponding one of the electrical contacts 22 and 24 (FIGS. 1, 7, and 8) of the electrical components 12 and 14 (FIGS. 1, 7, and 8), respectively to electrically connect the solder column body 54 to the corresponding electrical contact 22 or 24. The body 54 of the solder column 32 extends a length along a central longitudinal axis 62 from the base 44 to the tip 46. Specifically, the body 54 extends the length from the end surface 58 of the stem 50 to the contact surface 60 of the tip 46.

As will be described below, the body 54 of the solder column 32 is configured to at least partially compress along the length thereof when the solder column 32 is mated with the corresponding electrical contact 22 or 24 of the corresponding electrical component 12 or 14, respectively. The solder column body 54 is shown in FIGS. 1-5 before any compression. The body 54 of the solder column 32 may include any shapes that enable the solder column body 54 to function as described and/or illustrated herein. In the exemplary embodiment of FIGS. 1-5 and 7, the solder column body 54 has a greater cross-sectional area at the base 44 than at the tip 46.

The solder column body 54 includes four side walls 64 that extend along the length of the body 54 from the surface 56 of the base 44 to the contact surface 60. Base segments 64a of the side walls 64 are approximately planar and define a generally rectangular base 44, while tip segments 64b of the side walls 64 are approximately planar and define a pyramidal-shaped tip 46 that extends away from the base 44. The solder column body 54 thereby has a rectangular cross sectional shape along the length thereof. The tip segments 64b of the side walls 64 are angled, or sloped, inwardly relative to the central longitudinal axis 62 as the tip segments 64b extend from the base segments 64a to the contact surface 60. In other words, the body 54 of the solder column 32 is tapered along a portion of the length thereof. Specifically, in the exemplary embodiment, the tip 46 of the solder column body 54 is tapered inwardly relative to the central longitudinal axis 62 as the tip 46 extends away from the base 44. The tip 46 of the solder column body 54 thereby has a decreasing cross-sectional area as the tip 46 extends axially away from the base 44. As can be seen in FIG. 3, an exemplary cross section 66 (not shown in FIGS. 4 and 5) of the base 44 has a greater cross sectional area than an exemplary cross section 68 (not shown in FIGS. 4 and 5) of the tip 46. The taper of the tip 46 relative to the base 44 causes the surface area of the contact surface 60 to be less than the cross-sectional area of the cross section 66 of the base 44. In the exemplary embodiment, the slope of the tip segments 64*b* of the side walls 64 is linear instead of being curved. Accordingly, the tip 46 is linearly tapered inwardly relative to the central longitudinal axis 62 as the tip 46 extends axially away from the base 44. Alternatively, one or more of the tip segments 64*b* of the side walls 64 is curved such that the slope of the one or more of the tip segments 64*b* is curved. In some embodiments, one or more of the side walls 64 is non-planar.

In some alternative embodiments, a portion of the base 44 is tapered inwardly relative to the central longitudinal axis 62. Although in the exemplary embodiment the greatest cross sectional area of the solder column body 54 is located where the base 44 engages the substrate 34, any portions of the base 44 may have a greater cross sectional area than any portion of the tip 46. Moreover, the difference between the greatest and least cross sectional areas of the solder column 32 may be any amount. Each of the tip segments 64*b* of the side walls 64 may have any amount of linear or curved slope relative to the central longitudinal axis 62. As described above, the solder column body 54 is shown in FIGS. 3-5 before being at least partially compressed via engagement with the corresponding electrical contact 22 or 24. Although the contact surface 60 is shown as being approximately planar before any compression of the solder column body 54, alternatively the contact surface 60 may extend to an approximate point before the body 54 has at least partially compressed.

Figure 6:
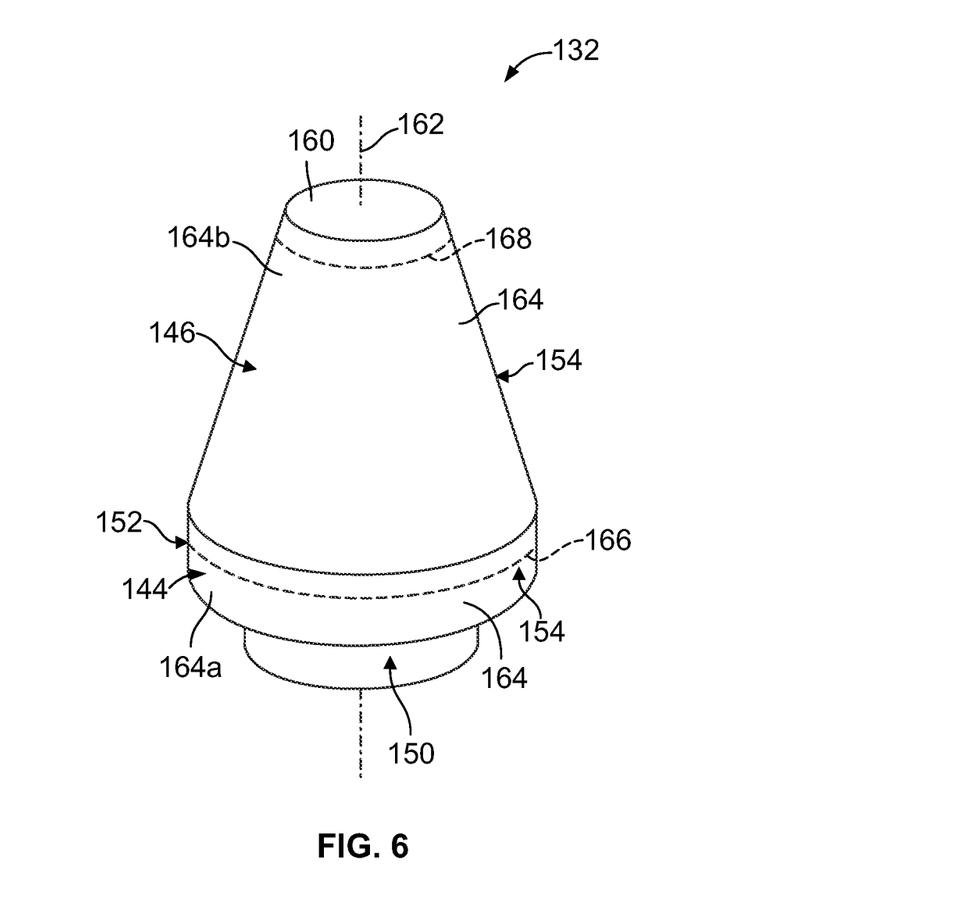
FIG. 6 is a perspective view of an exemplary alternative embodiment of a solder column.

Although the solder column body 54 includes four side walls 64 that define the rectangular and pyramidal shapes of the base 44 and tip 46, respectively, the solder column body 54 may include any number of the side walls 64 overall. Moreover, each of the base 44 and the tip 46 may be defined by any number of side wall segments 64*a* and 64*b*, respectively, that define any shape. For example, FIG. 6 is a perspective view of an exemplary alternative embodiment of a solder column 132. The solder column 132 includes a body 154 fabricated from any type of solder. The solder column body 154 includes a base 144 and a tip 146. The base 144 includes a stem 150 and a portion 152 that extends over the corresponding mating side surface 40 or 42 (FIG. 2) of the substrate 34 (FIGS. 2, 7, and 8). The tip 146 includes a contact surface 160. The contact surface 160 of the tip is configured to engage a corresponding one of the electrical contacts 22 and 24 (FIGS. 1, 7, and 8) of the electrical components 12 and 14 (FIGS. 1, 7, and 8), respectively, to electrically connect the solder column body 154 to the corresponding electrical contact 22 or 24. The body 154 of the solder column 132 extends a length along a central longitudinal axis 162

The body 154 of the solder column 132 is configured to at least partially compress along the length thereof when the solder column 132 is mated with the corresponding electrical contact 22 or 24. The solder column body 154 is shown in FIG. 6 before any compression. The solder column body 154 includes a single side wall 164 that extends along the length of the body 154. A base segment 164*a* of the side wall 164 is curved to define a circular base 144, while tip segment 164*b* of the side wall 164 is curved to define a conically-shaped tip 146 that extends away from the base 144. The solder column body 154 thereby has a circular cross sectional shape at every axial location along the length thereof. The tip segment 164*b* of the side walls 164 is angled, or sloped, inwardly relative to the central longitudinal axis 162 as the tip segment 164*b* extends from the base segment 164*a* to the contact surface 160. In other words, the body 154 of the solder column 132 is tapered along a portion of the length thereof. Specifically, in the exemplary embodiment, the tip 146 of the solder column body 154 is tapered inwardly relative to the central longitudinal axis 162 as the tip 146 extends away from the base 144. The tip 146 of the solder column body 154 thereby has a decreasing cross-sectional area as the tip 146 extends away from the base 144.

An exemplary cross section 166 of the base 144 has a greater cross sectional area than an exemplary cross section 168 of the tip 146. The taper of the tip 146 relative to the base 144 causes the surface area of the contact surface 160 to be less than the cross-sectional area of the cross section 166 of the base 144. In the exemplary embodiment, the slope of the tip segment 164*b* of the side wall 64 is linear instead of being curved. Accordingly, the tip 146 is linearly tapered inwardly relative to the central longitudinal axis 162 as the tip 146 extends away from the base 144. Alternatively, the tip segment 164*b* of the side wall 164 is curved such that the slope of the tip segment 164 is curved.

FIGS. 7 and 8 are elevational views of a portion of the electrical component assembly 10. In operation, the interposer 16 is positioned between and aligned with the electrical components 12 and 14. The electrical components 12 and 14 are moved toward each other to bring the electrical contacts 22 of the electrical component 12 into engagement with the contact surfaces 60 of the corresponding solder columns 32 on the mating side 36 of the interposer substrate 34. Similarly, the electrical contacts 24 of the electrical component 14 are brought into engagement with the contact surfaces 60 of the corresponding solder columns 32 on the mating side 38 of the interposer substrate 34. A load is then applied to one or both of the electrical components 12 and 14 to compress the interposer 16 therebetween and thereby at least partially compress the solder columns 32. FIG. 7 illustrates the solder columns 32 before being compressed, while FIG. 8 illustrates the solder columns 32 after being compressed. As should be apparent from FIGS. 7 and 8, the tips 46 of the solder columns 32 partially compress along the length thereof such that the surface area of the contact surface 60 increases. The load is applied to the electrical components 12 and/or 14 until the solder column tips 46 have compressed enough to provide the contact surfaces 60 with a surface area that establishes a reliable electrical connection between the solder columns 32 and the electrical contacts 22 and 24 of the electrical components 12 and 14, respectively. The compression of the solder columns 32 may exert a compression normal force on the electrical contacts 22 and 24 that generates a relatively high hertz stress, which may facilitate establishing and/or maintaining a reliable electrical connection. The solder columns 32 of the interposer 16 thereby electrically connect the electrical contacts 22 and 24 together to establish an electrical connection between the electrical components 12 and 14. In some alternative embodiments, the base 44 may at least partially compress in addition to the at least partial compression of the tip 46.

The interposer 16 creates a separable connection between the electrical components 12 and 14. After the separable connection has been established, the solder columns 32 can be reflowed to create a permanent connection between the electrical component 12, the interposer 16, and the electrical component 14. Alternatively, the separable connection between the electrical components 12 and 14 and the interposer 16 can be used to conduct functional testing of various circuits, components, devices, and/or the like of the electrical components 12 and 14. Accordingly, if any circuits, components, devices, and/or the like of the electrical components 12 and/or 14 fail the functional test, the electrical components 12 and/or 14 can be disconnected from the interposer 16 without damage thereto. The electrical component 12 or 14 that passed the test can thereby be reused without being fixed, refurbished, modified, and/or the like. After a functional test wherein the electrical components 12 and 14 pass, the solder columns 32 can be reflowed to create a permanent electrical connection between the electrical component 12, the interposer 16, and the electrical component 14. In some embodiments, the interposer 16 may be reused with different electrical components 12 and/or 14 if the solder columns 32 have not been reflowed to create the permanent connection.

Figure 9:
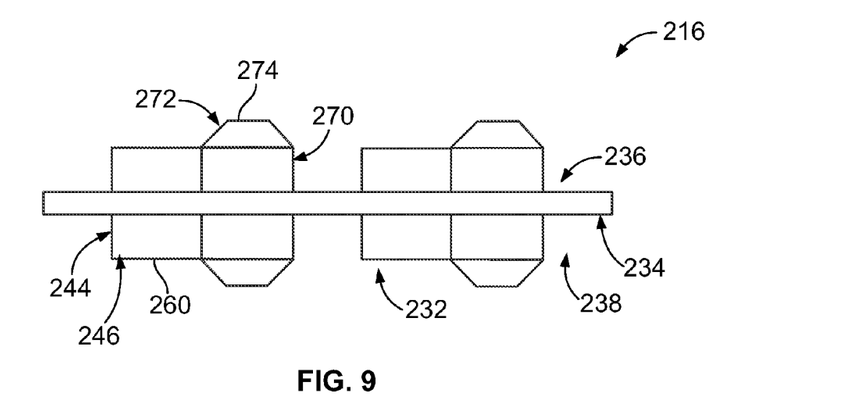
FIG. 9 is an elevational view of an exemplary alternative embodiment of an interposer.

FIG. 9 is an elevational view of an exemplary alternative embodiment of an interposer 216. The interposer 216 includes a substrate 234 that holds a plurality of solder columns 232 and a plurality of electrically conductive elastomeric elements 270. The substrate 234 includes opposite mating sides 236 and 238. Each solder column 232 includes a base 244 and a tip 246. Each solder column 232 extends a length away from the corresponding mating side 236 or 238 of the substrate 234 to the tip 246. The tip 246 of each solder column 232 includes a contact surface 260 that is configured engage a corresponding one of the electrical contacts 22 and 24 (FIGS. 1, 7, and 8) of the electrical components 12 and 14 (FIGS. 1, 7, and 8), respectively to electrically connect the solder column 232 to the corresponding electrical contact 22 or 24. Each elastomeric element 270 extends a length away from the corresponding mating side 236 or 238 of the substrate 234 to a tip 272. The tip 272 of each elastomeric element 270 includes a contact surface 274 that is configured engage a corresponding one of the electrical contacts 22 and 24 of the electrical components 12 and 14, respectively.

In operation, the interposer 216 is positioned between and aligned with the electrical components 12 and 14. The electrical components 12 and 14 are moved toward each other to bring the electrical contacts 22 of the electrical component 12 into engagement with the contact surfaces 274 of the elastomeric elements 270 on the mating side 236 of the interposer substrate 234. Similarly, the electrical contacts 24 of the electrical component 14 are brought into engagement with the contact surfaces 274 of the elastomeric elements 270 on the mating side 238 of the interposer substrate 234. The engagement between the elastomeric elements 270 and the electrical contacts 22 and 24 establishes an electrical connection between the elastomeric elements 270 and the electrical contacts 22 and 24. The elastomeric elements 270 of the interposer 216 thereby electrically connect the electrical contacts 22 and 24 together to establish an electrical connection between the electrical components 12 and 14.

The interposer 216 creates a separable connection between the electrical components 12 and 14 using the elastomeric elements 270. After the separable connection has been established, the elastomeric elements 270 can be compressed to engage the solder columns 232 with the electrical contacts 22 and 24. The solder columns 232 can be reflowed to create a permanent connection between the electrical component 12, the interposer 216, and the electrical component 14. Alternatively, the separable connection between the electrical components 12 and 14 and the interposer 216 can be used to conduct functional testing of various circuits, components, devices, and/or the like of the electrical components 12 and 14. In some embodiments, the interposer 216 may be reused with different electrical components 12 and/or 14 if the solder columns 232 have not been reflowed to create the permanent connection.

Figure 10:
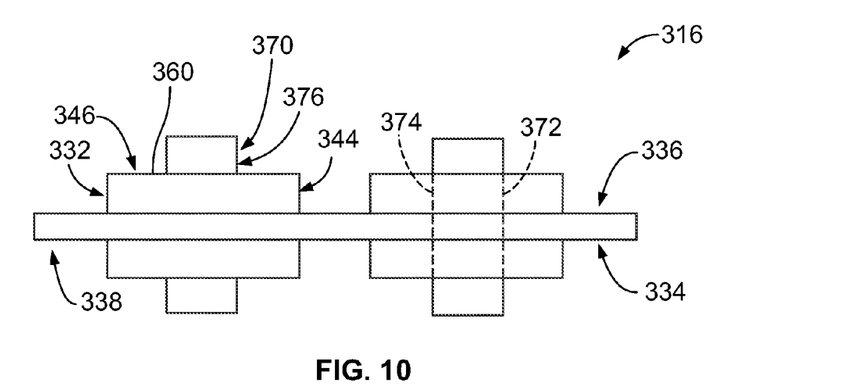
FIG. 10 is an elevational view of another exemplary alternative embodiment of an interposer.

FIG. 10 is an elevational view of another exemplary alternative embodiment of an interposer 316. The interposer 316 includes a substrate 334 that holds a plurality of solder columns 332 and a plurality of elastomeric elements 370. The substrate 334 includes opposite mating sides 336 and 338. Each solder column 332 includes a base 344 and a tip 346. Each solder column 332 extends a length away from the corresponding mating side 336 or 338 of the substrate 334 to the tip 346. The tip 346 of each solder column 332 includes a contact surface 360 that is configured engage a corresponding one of the electrical contacts 22 and 24 (FIGS. 1, 7, and 8) of the electrical components 12 and 14 (FIGS. 1, 7, and 8), respectively to electrically connect the solder column 332 to the corresponding electrical contact 22 or 24. The solder columns 332 include central openings 372 within which the elastomeric elements 370 extend. Specifically, each elastomeric element 370 includes a base 374 that extends within the central opening 372 of a corresponding one of the solder columns 332 and a tip 376 that extends away from the contact surface 360 of each solder column 332.

In operation, the interposer 316 is positioned between and aligned with the electrical components 12 and 14. The electrical components 12 and 14 are moved toward each other to bring the electrical contacts 22 of the electrical component 12 into engagement with the tips 376 of the elastomeric elements 370 on the mating side 336 of the interposer substrate 334. Similarly, the electrical contacts 24 of the electrical component 14 are brought into engagement with the tips 376 of the elastomeric elements 370 on the mating side 338 of the interposer substrate 334. The engagement between the elastomeric elements 370 and the electrical contacts 22 and 24 establishes an electrical connection between the elastomeric elements 370 and the electrical contacts 22 and 24. The elastomeric elements 370 of the interposer 216 thereby electrically connect the electrical contacts 22 and 24 together to establish an electrical connection between the electrical components 12 and 14.

The interposer 316 creates a separable connection between the electrical components 12 and 14 via the elastomeric elements 370. After the separable connection has been established, the elastomeric elements 370 can be compressed to engage the solder columns 332 with the electrical contacts 22 and 24. The solder columns 332 can be reflowed to create a permanent connection between the electrical component 12, the interposer 316, and the electrical component 14. Alternatively, the separable connection between the electrical components 12 and 14 and the interposer 316 can be used to conduct functional testing of various circuits, components, devices, and/or the like of the electrical components 12 and 14. In some embodiments, the interposer 316 may be reused with different electrical components 12 and/or 14 if the solder columns 332 have not been reflowed to create the permanent connection.

Exemplary embodiments are described and/or illustrated herein in detail. The embodiments are not limited to the specific embodiments described herein, but rather, components and/or steps of each embodiment may be utilized independently and separately from other components and/or steps described herein. Each component, and/or each step of one embodiment, can also be used in combination with other components and/or steps of other embodiments. When introducing elements/components/etc. described and/or illustrated herein, the articles "a", "an", "the", "said", and "at least one" are intended to mean that there are one or more of the element(s)/component(s)/etc. The terms "comprising", "including" and "having" are intended to be inclusive and mean that there may be additional element(s)/component(s)/etc. other than the listed element(s)/component(s)/etc. Moreover, the terms "first," "second," and "third," etc. in the claims are used merely as labels, and are not intended to impose numerical requirements on their objects. Similarly, the terms "front", "rear", "top", "bottom", and "side" etc. in the claims are used merely as labels, and are not intended to impose orientational requirements on their objects. Dimensions, types of materials, orientations of the various components, and the number and positions of the various components described and/or illustrated herein are intended to define parameters of certain embodiments, and are by no means limiting and are merely exemplary embodiments. Many other embodiments and modifications within the spirit and scope of the claims will be apparent to those of skill in the art upon reviewing the description and illustrations. The scope of the subject matter described and/or illustrated herein should therefore be determined with reference to the appended claims, along with the full scope of equivalents to which such claims are entitled. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

While the subject matter described and/or illustrated herein has been described in terms of various specific embodiments, those skilled in the art will recognize that the subject matter described and/or illustrated herein can be practiced with modification within the spirit and scope of the claims.

What is claimed is:

1. An electrical connector for mating with an electrical component, said connector comprising:
   a substrate having a mating side; and
   a solder column extending from the mating side of the substrate, the solder column comprising a base that is engaged with the substrate, the solder column extending a length away from the mating side of the substrate to a tip, the tip comprising a contact surface that is configured to engage and electrically connect to an electrical contact of the electrical component, wherein the solder column is linearly tapered along at least a portion of the length from the base to the tip, and wherein the solder column is configured to at least partially compress along the length thereof as the contact surface is engaged with the electrical contact of the electrical component.

2. The connector according to claim 1, wherein the solder column comprises a greater cross-sectional area at the base than at the tip.

3. The connector according to claim 1, wherein the base of the solder column comprises a greater cross-sectional area than a surface area of the contact surface of the tip of the solder column.

4. The connector according to claim 1, wherein the solder column comprises a pyramidal shape.

5. The connector according to claim 1, wherein the solder column comprises a rectangular cross-section at every axial location along the length of the solder column with a decreasing cross-sectional area from the base to the tip.

6. The connector according to claim 1, wherein the base of the solder column comprises a circular cross-sectional shape, the solder column comprising a conical segment that extends away from the base and comprises the tip.

7. The connector according to claim 1, wherein the solder column comprises an approximately planar side wall that extends along at least a portion of the length of the solder column.

8. The connector according to claim 1, wherein the mating side of the substrate comprises a mating side surface, the base of the solder column being engaged with the mating side surface, wherein the greatest cross-sectional area of the solder column is located at the portion of the base that engages the mating side surface.

9. The connector according to claim 1, wherein the contact surface of the tip is approximately planar before being engaged with the electrical contact of the electrical component.

10. An interposer for electrically connecting first and second electrical components, said interposer comprising: a substrate having opposite first and second mating sides; a first solder column extending from the first mating side of the substrate, the first solder column comprising a base that is engaged with the substrate, the first solder column extending a length from the base to a tip, the tip comprising a first contact surface that is configured to engage and electrically connect to an electrical contact of the first electrical component, wherein the first solder column comprises a pyramidal shape; and
    a second solder column extending from the second mating side of the substrate, the second solder column comprising a second contact surface that is configured to engage and electrically connect to an electrical contact of the second electrical component; wherein the first solder column is configured to at least partially compress along the length thereof as the first contact surface is engaged with the electrical contact of the first electrical component.

11. The interposer according to claim 10, wherein the first solder column comprises a greater cross-sectional area at the base than at the tip.

12. The interposer according to claim 10, wherein the substrate comprises a through hole extending through the substrate from the first mating side to the second mating side, the first and second solder columns each extending partially within the through hole and being integrally formed or connected together such that the first and second solder columns form a single solder column that extends through the through hole of the substrate.

13. The interposer according to claim 10, wherein the first solder column is configured to at least partially compress along the length thereof as the first contact surface is engaged with the electrical contact of the first electrical component, the contact surface of the tip having a greater surface area after being at least partially compressed.

14. The interposer according to claim 10, wherein the base of the first solder column is a first base and the tip of the first solder column is a first tip, the second solder column comprising a second base that is engaged with the substrate, the second solder column extending a length from the second base to a second tip, the second tip comprising the second contact surface, wherein the second solder column comprises a pyramidal shape.

15. An electrical connector for mating with an electrical component, said connector comprising: a substrate having a mating side; and
    a solder column extending from the mating side of the substrate, the solder column comprising a base that is engaged with the substrate, the solder column extending a length away from the mating side of the substrate to a tip, the tip comprising a contact surface that is configured to engage and electrically connect to an electrical contact of the electrical component, wherein the solder column comprises a pyramidal or a conical shape; wherein the solder column is configured to at least partially compress along the length thereof as the contact surface is engaged with the electrical contact of the electrical component.

16. The connector according to claim 1, wherein engagement between the contact surface of the solder column and the electrical contact of the electrical component creates a separable electrical connection between the solder column and the electrical contact such that the electrical component can be tested without reflowing the solder column.

17. The connector according to claim 1, wherein the solder column comprises a conical shape.

18. The connector according to claim 1, wherein the contact surface of the tip has a greater surface area after being at least partially compressed.

* * * * *